United States Patent [19]
Cohen et al.

[11] Patent Number: 5,559,367
[45] Date of Patent: Sep. 24, 1996

[54] DIAMOND-LIKE CARBON FOR USE IN VLSI AND ULSI INTERCONNECT SYSTEMS

[75] Inventors: Stephen A. Cohen, Wappingers Falls; Daniel C. Edelstein, New Rochelle; Alfred Grill, White Plains; Jurij R. Paraszczak, Pleasantville; Vishnubhai V. Patel, Yorktown, all of N.Y.

[73] Assignee: International Business Machines Corporation, Armonk, N.Y.

[21] Appl. No.: 273,689

[22] Filed: Jul. 12, 1994

[51] Int. Cl.⁶ .............................. H01L 31/0312
[52] U.S. Cl. .................. 257/77; 257/646; 257/758; 257/774
[58] Field of Search .............. 257/646, 77, 758, 257/774

[56] References Cited

U.S. PATENT DOCUMENTS

| | | |
|---|---|---|
| 4,671,852 | 6/1987 | Pyke . |
| 4,944,836 | 7/1990 | Beyer et al. . |
| 4,987,007 | 1/1991 | Wagal et al. ............. 257/646 |
| 5,064,809 | 11/1991 | Hed . |
| 5,082,359 | 1/1992 | Kirkpatrick . |
| 5,082,522 | 1/1992 | Purdes et al. . |
| 5,087,434 | 2/1992 | Frenklach et al. ............ 257/646 |
| 5,087,959 | 2/1992 | Omori et al. . |
| 5,126,206 | 6/1992 | Garg et al. . |
| 5,186,973 | 2/1993 | Garg et al. . |
| 5,246,884 | 9/1993 | Jaso et al. . |
| 5,266,409 | 11/1993 | Schmidt et al. . |

OTHER PUBLICATIONS

Aisenberg et al., "Ion–Beam Deposition of Thin Films of Diamondlike Carbon", *J. of Appl. Phys.*, vol. 42, No. 7, pp. 2953–2958 (1971).

Grill et al., "Diamondlike carbon films by rf plasma–assisted chemical vapor deposition from acetylene", *J. of Res. and Develop.*, vol. 34, No. 6, pp. 849–857 (1990).

Grill et al., "Diamondlike Carbon Deposited by DC PACVD", *Diamond Films and Techn.*, vol. 1, No. 4, pp. 219–233 (1992).

IBM Technical Disclosure Bulletin, vol. 35, No. 1B, Jun. 1992, New York, U.S., p. 211.

Patent Abstracts of Japan (P–1272) vol. 015, No. 435, Nov. 6, 1991 and JP–A–03 181917 (RICOH CO LTD), Aug. 7, 1991 (Abstract).

*Primary Examiner*—Edward Wojciechowicz
*Attorney, Agent, or Firm*—Scully, Scott, Murphy & Presser

[57] ABSTRACT

The present invention relates to semiconductor devices comprising as one of their structural components diamond-like carbon as an insulator for spacing apart one or more levels of a conductor on an integrated circuit chip. The present invention also relates to a method for forming an integrated structure and to the integrated structure produced therefrom. The present invention further provides a method for selectively ion etching a diamond-like carbon layer from a substrate containing such a layer.

42 Claims, 5 Drawing Sheets

DIAMOND-LIKE CARBON FOR USE IN VLSI AND ULSI INTERCONNECT SYSTEMS

TECHNICAL FIELD

The present invention relates to semiconductor devices which comprise as one of their structural components an insulator for spacing apart one or more levels of a conductor on an integrated circuit chip such as a Field Effect Transistor (FET), a Complementary Metal Oxide Semiconductor (CMOS) or a bipolar device. The insulators of the instant invention which can be used in various semiconductor devices have a lower dielectric constant as compared to prior art insulators composed mainly of silicon dioxide films. Moreover, the insulators of the present invention can be structurally isotropic which property further reduces variations in the parasitic capacitance and crosstalk between the conductors located atop the insulated semiconductor device.

The low dielectric constant of the insulators of the instant invention is especially suitable for use in Very Large Scale Integrated (VLSI) or Ultra-Large Scale Integrated (ULSI) applications. Accordingly, the present invention also relates to a method for forming an interconnect structure and to the interconnect structure produced by the aforementioned method.

The present invention is further directed to a method for selectively ion etching a diamond-like carbon layer from a suitable substrate containing such a layer. The above method is used in the fabrication of planarized multilevel metallized semiconductor structures, which structures may also contain a pattern therein.

PRIOR ART

Amorphous carbon (a-C) films, also called diamond-like carbon (DLC) films because of their hardness, have drawn a lot of attention in the art of semiconductor fabrication because of their potential use as coatings for such devices. For these types of films to be useful in chip process technology or in hostile thermal and mechanical environments, high thermal stability at high temperature is necessary.

Diamond-like carbon films are defined as metastable, amorphous materials which may contain a microcrystalline phase. Diamond-like carbon films have a dielectric constant of $\leq 3.2$ and are further characterized as having a high electrical resistivity, high wear resistance and chemical inertness.

Diamond-like carbon films are differentiated from diamond layers because diamond-like carbon layers may contain a microcrystalline phase in an amorphous matrix while diamond layers are polycrystalline material with crystallites up to tens of microns in size. In other words, diamond layers do not contain a microcrystalline phase whereas diamond-like carbon films contain such a phase. The diamond-like carbon films were first deposited by Aisenberg et al., J. Appl. Phys. 42, 2953 (1971). Since this first initial investigation of depositing diamond-like carboil films, a variety of different techniques such as dc or rf plasma-assisted carbon vapor deposition, sputtering, and ion-beam sputtering have been utilized. Furthermore, a variety of carbon-bearing source materials, i.e. solid, liquid or gaseous, have also been utilized in order to improve the hardness and thermal stability of the diamond-like carbon films.

A semiconductor chip consists of an array of devices whose contacts are interconnected by patterns of metal wiring called traces. In VLSI chips, these metal patterns are multilayered and are separated by layers of an insulating material. Interlevel contacts between metal wiring patterns are made by through-holes, which are etched through the layers of the insulating material. Typical chip designs consist of one or more wiring levels. Insulating materials are employed between the wiring levels to space apart the levels. As circuit cost and a need for improved performance increases, there is a continued demand on the fabrication process for improving the chip design of semiconductor devices.

In VLSI chips, the insulating material is typically silicon dioxide with a dielectric constant of about 3.9 to about 4.1. To further reduce interconnect capacitance, polyimide films with lower dielectric constants (e.g. 2.9–3.4) have been proposed and demonstrated. Some polyimide films, however, have structural anisotropy that is reflected in an anisotropy of their dielectric constants. Moreover, insulators composed of a polyimide film often have a planar dielectric constant which differs from its out-of-plane dielectric constant, i.e. the polyimide films are anisotropic in nature. This anisotropic characteristic of various polyimide films results in larger parasitic capacitances and crosstalk between the metal wiring patterns of the semiconductor chip. In order to reduce the parasitic capacitances and crosstalk of semiconductor chips, improved insulating materials which have a low dielectric constant that are uniform in all directions, i.e. isotropic, are currently being developed.

Despite the insulating materials that are currently employed in the art to space apart the wiring levels of a semiconductor device, there is still a continual need to provide an insulating material for use in semiconductor devices that is hard, and has a relatively low dielectric constant which is uniform in all directions. Such a hard insulating material possessing a uniform, low dielectric constant would have high marketability and would be exceptionally useful in the fabrication of various semiconductor devices.

In the art of fabricating semiconductor devices, a silicon wafer is metallized with circuitry traces and pads, typically of aluminum-copper alloy, coated with $SiO_2$. This process results in an irregular topography which may ultimately damage the circuitry traces and pads or insulation. Thus, in order to align the semiconductor devices precisely level-to-level, it is necessary to achieve a smooth topography without damaging the circuitry traces or pads.

One way to provide such a smooth topography of the semiconductor device is to planarize the surface of the semiconductor device by using an etch stop with a polishing slurry. Etch stops and polishing slurries are well known and have been successfully utilized in the art.

U.S. Pat. No. 4,671,852 to Beyer et al., for example, describes the removal of undesired $SiO_2$ protuberances called "bird's heads" using a combination of chemical-mechanical polishing and $Si_3N_4$ blanket deposited at 700° C. by Low Pressure Chemical Vapor Deposition (LPCVD). The Beyer et al. process is dependent upon the selection of polishing pads and the polishing solution chemistry.

U.S. Pat. No. 4,944,836 to Beyer et al. describes a chem-mech polishing slurry to be used with an $Si_3N_4$ etch stop layer, as the water-based alumina slurry formerly used has been found lacking with respect to the etch rate ratio of AlCu to $SiO_2$.

Not all semiconductor structures are compatible with processing at a high temperature level such as 700° C. For example, in multilevel interconnection systems on wafers with circuits, it is necessary to maintain all processing steps at or below about 400° C. in order to prevent diffusion of metal into the underlying devices. Silicon nitride deposited at a temperature compatible with the processing of interconnects, i.e. at about 325° C., has proven to be insufficiently hard to function effectively as an etch stop in "Back End Of the Line" (BEOL) interconnection processes. Aluminum oxide, $Al_2O_3$, which is harder than $SiO_2$ has proven to polish at a faster rate than $SiO_2$, presumably due to chemical reactions with the polish, making it an ineffective etch stop material.

Co-assigned U.S. Pat. No. 5,246,884 to Jaso et al. uses a conventional diamond or diamond-like carbon material as an etch stop for fabricating planarized metallized semiconductor chips. Specifically, this reference provides a method of planarizing a semiconductor device which comprises the steps of (a) providing a planar substrate on which is disposed topographical featuring; (b) coating the substrate and topographical featuring overall with a first layer of insulating material; (c) coating the first layer with a second layer comprising conformal diamond or diamond-like carbon material, wherein the diamond or diamond-like carbon is deposited within a temperature range of about 75° to about 350° C. by CVD or sputtering; (d) chemical-mechanical polishing with a polishing pad in a slurry such that the layers of material over the topographical featuring is removed at a faster rate than the material over the planar substrate; and (e) stopping the process when substantial overall planarity is achieved.

Despite the current state of the art there is a continued need to develop a suitable etch stop which terminates the etching process before it damages the semiconductor device.

SUMMARY OF THE INVENTION

The present invention relates to improved semiconductor devices which contain an insulator for spacing apart one or more conductive levels of such a device on an integrated circuit chip. The present invention further provides a method of fabricating an interconnect structure containing one or more interlevel insulators of the present invention.

The insulators of the present invention which represent a significant improvement over prior art insulators, especially in regard to having a lower dielectric constant, comprise a diamond-like carbon material which is used in place of a silicon dioxide or a polymeric film as a low dielectric constant interlevel insulator for back end contact for FET and CMOS applications. The diamond-like carbon material which is employed in the instant invention is selected from the group consisting of hydrogenated amorphous carbon, amorphous carbon, amorphous diamond, fluorinated hydrogenated amorphous carbon, fluorinated amorphous carbon and fluorinated amorphous diamond.

The insulators of the instant invention, which are composed of a diamond-like carbon material, do not have a structural anisotropy and are characterized as having a high electrical resistivity, high wear resistance and as being chemically inert. Moreover, depending on the deposition conditions employed in the present invention, the insulators will have current voltage (IV) characteristics which are comparable to insulators that are composed of silicon dioxide or polyimide films. Thus, because of the properties mentioned hereinabove, the insulators of the present invention that are composed of diamond-like carbon material have less parasitic capacitances and reduced crosstalk compared to prior art interlevel insulators which are composed of a silicon dioxide or a polyimide film.

The present invention further relates to a method of selectively etching, via a reactive ion etch (RIE) method and/or a chemical-mechanical (chem-mech) method, an amorphous carbon or diamond layer from VLSI or ULSI semiconductor devices to provide planarized interconnects which depending on their applications may have a pattern therein. In accordance with this aspect of the present invention, the diamond-like carbon material which is doped with Si behaves as a $O_2$ RIE stop and $CF_4$ RIE stop layer and/or a chem-mech stop layer for use in VLSI or ULSI wiring systems, especially as an etch stop layer or polish stop in $SiO_2$-based or polymeric based BEOL applications.

It should be noted that the diamond-like carbon material employed in the present invention as an etch-stop or polishing layer differs from the diamond-like carbon material employed in Jaso et al. since the reference does not contemplate doping of the diamond-like carbon material with Si. It is emphasized that a diamond-like carbon material that is doped with Si etches at a slower rate in an oxygen plasma compared to the diamond-like carbon material disclosed in Jaso et al. Thus, it is possible to effectively terminate the etching or polishing process before damaging the semiconductor device by using the Si doped diamond-like carbon material of the instant invention.

DESCRIPTION OF THE PREFERRED EMBODIMENT

The present invention relates to semiconductor devices which contain as part of their structures at least one insulator layer for spacing apart one or more levels of a conductor on an integrated circuit chip. The present invention further provides an interconnect structure comprising at least one of the aforementioned insulators and a method for forming the interconnect structure on a suitable substrate.

In accordance with the first aspect of the instant invention, the insulator of the present invention comprises (a) a substrate having an upper surface with an exposed first layer of metal; (b) an insulator layer of diamond-like carbon formed on said upper surface of said substrate; and (c) a second layer of metal patterned to form a plurality of conductors on said insulator layer.

In accordance with another aspect of the instant invention, the interconnect structure for use on an integrated semiconductor device comprises (a) a substrate having an upper surface with an exposed first area of a metal and an exposed second area of insulation selected from the group consisting of silicon oxide and diamond-like carbon; (b) a first layer of diamond-like carbon material formed on the upper surface of the substrate; (c) a second layer of metal patterned to form a plurality of conductors formed on top of the diamond-like carbon material; and (d) a metal feed through electrically connecting selected first areas to one or more of the plurality of conductors.

Figure 1:
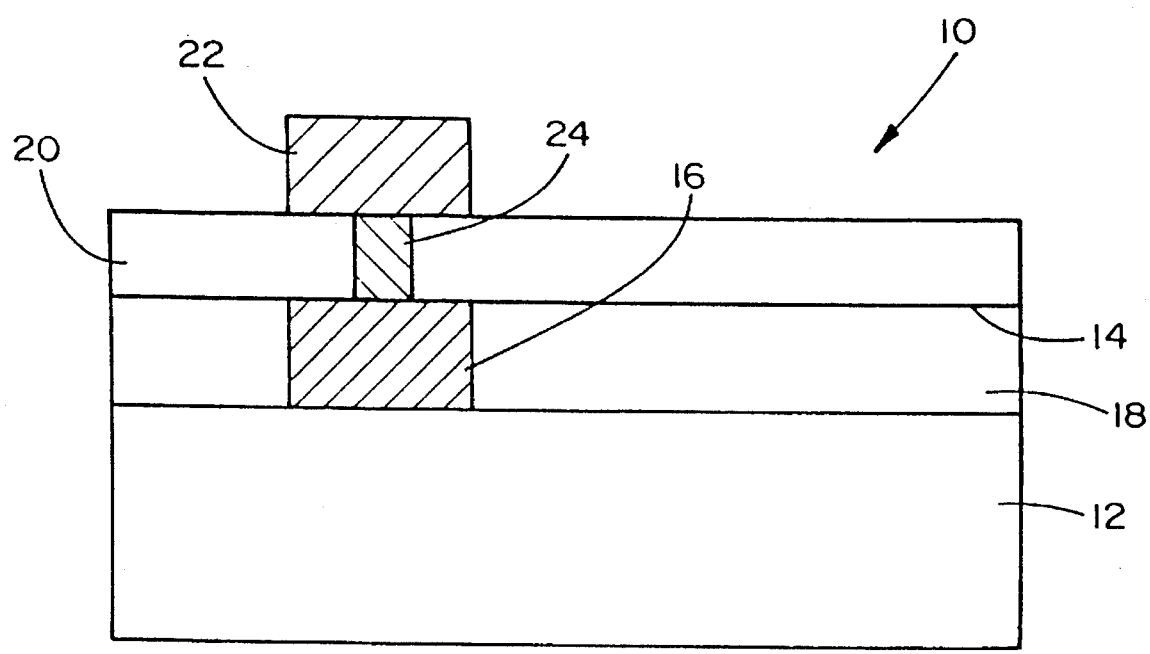
FIG. 1 is a cross-sectional view of a semiconductor device which contains a diamond-like carbon layer as an insulating material for spacing apart two levels of a semiconductor device.

An integrated semiconductor device as defined above is shown in FIG. 1. The integrated semiconductor device 10 comprises a substrate 12 having an upper surface 14 comprising an exposed first area of metal 16 and an exposed second area of insulation 18. A layer of diamond-like carbon material 20 is then deposited on the upper surface of the substrate 14. A second layer of metal 22 is formed over the exposed first area 16 and metal feed through 24 is employed to contact the exposed first area of metal 16 to the second metal layer 22.

Suitable metals employed in the instant invention include Al, Cu, W, Ti and Ta. Alloys of these metals are also contemplated in the present invention. The metal, i.e. Al, Cu, W, Ti, Ta or alloys thereof, that forms the exposed first area of the substrate and the metal of the second layer is deposited by techniques that are well known in the art. For example, the metal can be deposited using a sputtering or chemical vapor deposition technique.

The diamond-like carbon material which is employed in the present invention as the insulator material is selected from the group consisting of hydrogenated amorphous carbon, amorphous diamond, fluorinated hydrogenated amorphous carbon, fluorinated amorphous carbon and fluorinated amorphous diamond.

The diamond-like carbon material is deposited by techniques that are well known in the art. Suitable deposition techniques include plasma assisted chemical vapor deposition (PACVD), sputtering, ion beam deposition, laser ablation and the likes thereof. Of these deposition techniques, PACVD of a diamond-like carbon material is preferred.

The reaction conditions parameters and apparatus employed in this invention for depositing the diamond-like carbon material are described in Grill et al., "Diamond Like Carbon: Preparation, Properties and Applications", IBM J. Res. Develop., 34 (1990) 849 or Grill et al., "Diamond-Like Carbon Deposited by DC PACVD", Diamond Films and Technology, 1 (1992) 219, the contents of which are incorporated herein by reference.

When a fluorinated diamond-like carbon material is employed, it is particularly preferred that at least 1 atomic % of the fluorine atoms be covalently bound to the carbon atoms of the diamond-like carbon material. More preferably, about 10 to about 40 atomic % of the fluorine atoms are covalently bound to the carbon atoms of the diamond-like carbon material.

It should be noted that the non-fluorinated or fluorinated diamond-like material may be further doped with silicon (Si) or germanium (Ge). In accordance with this embodiment of the instant invention, the non-fluorinated or fluorinated diamond-like carbon material is doped with x atomic percent of Si or Ge wherein x is in the range from about 0 to about 25 atomic %. It is particularly preferred, however, if the fluorinated diamond-like carbon material is doped with about 5 to about 15 atomic % Si or Ge.

Figure 2:
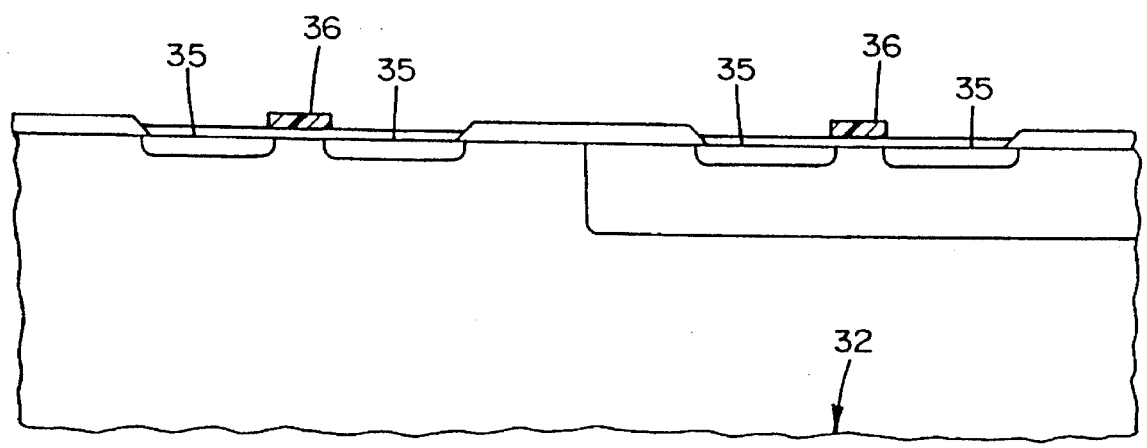
FIG. 2 is a typical example of a CMOS device. The gate, drain and source regions have to be electrically connected to the wiring described in the instant invention.

FIG. 2 is a typical CMOS structure having implanted drain and source regions 35 in the substrate 32 as well as polysilicon gates 36 which have to be contacted by the wiring described in the instant invention.

Figure 3:
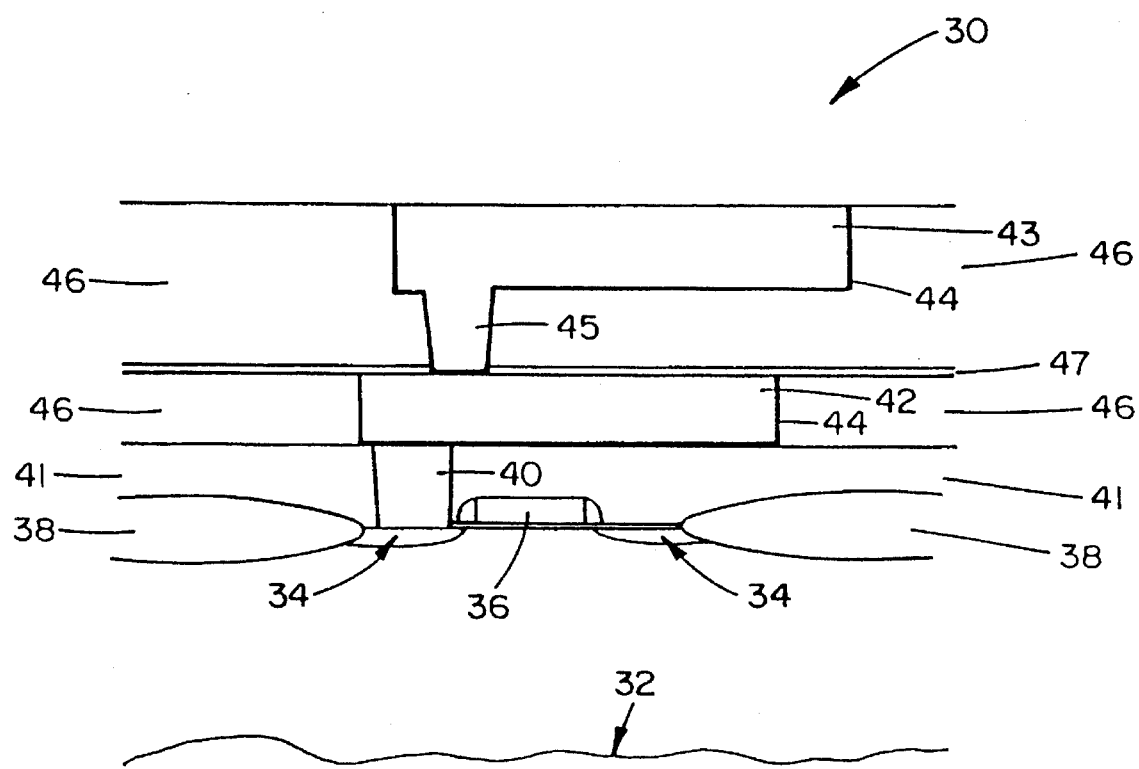
FIG. 3 is a cross-sectional view of a Field Effect Transistor of the CMOS structure shown in FIG. 2 which contains a diamond-like carbon film as a first and a second wiring dielectric layer. This is an example of how part of the structure shown in FIG. 2 is contacted by the wiring structure of the invention.

FIG. 3 is a cross-sectional view of a Field Effect Transistor (FET) containing an insulator for spacing apart one of more levels of conductors on the integrated circuit chip which is prepared in accordance with the present invention, revealing examples for contacting the source regions of FIG. 2. Specifically, FIG. 3 is a FET device 30 which comprises a substrate 32 having implanted source and drain regions 34, a polycrystalline silicon gate region 36, and recessed oxide regions 38. The FET device 30 further comprises CVD W trench fills 40, a passivating layer of silicon dioxide or silicon nitride 41, Cu, Al or W interconnects 42 and 43, a metal liner of Ti, Ta, W or compounds or alloys thereof 44, an interlevel via filled with W, Al or Cu 45, a diamond-like carbon material 46, and a capping layer of diamond-like carbon material, silicon dioxide, silicon nitride, boron nitride or compounds thereof 47. The diamond-like carbon material 46 of the FET device 30 acts as an insulator for spacing apart contact levels 42 and 43 of the FET device.

The insulators of the present invention that are composed of a diamond-like carbon material have a low dielectric constant which is uniform in all directions. Thus, the insulators of the present invention represent a significant improvement over prior art insulators.

In accordance with the another aspect of the instant invention, a method is provided for forming an interconnect structure on a substrate having conducting regions on an upper surface thereof. Such an interconnect structure prepared by the method of the instant invention is shown in FIG. 3.

The method of the instant invention for forming such an interconnect structure onto the surface of a substrate having conductive regions on an upper surface comprises (a) forming a first layer of diamond-like carbon material selected from the group consisting of hydrogenated amorphous carbon, amorphous carbon, amorphous diamond, and fluorinated diamond-like carbon onto the upper surface of the substrate, wherein said diamond-like carbon material is doped with v atomic percent Si or Ge; (b) forming a second layer of diamond-like carbon material selected from the group consisting of hydrogenated amorphous carbon, amorphous carbon, amorphous diamond, and fluorinated diamond-like carbon on said first layer, wherein said diamond-like carbon material is doped with w atomic Si or Ge; (c) forming a third layer of diamond-like carbon material selected from the group consisting of hydrogenated amorphous carbon, amorphous carbon, amorphous diamond, and fluorinated diamond-like carbon on said second layer, wherein said diamond-like carbon material is doped with x atomic percent Si or Ge; (d) forming a fourth layer of diamond-like carbon material selected from the group consisting of hydrogenated amorphous carbon, amorphous carbon, amorphous diamond, and fluorinated diamond-like carbon on said third layer, wherein said diamond-like carbon material is doped with y atomic percent Si or Ge; (e) forming a fifth layer of diamond-like carbon material selected from the group consisting of hydrogenated amorphous carbon, amorphous carbon, amorphous diamond, and fluorinated diamond-like carbon on said fourth layer, wherein said diamond-like carbon material is doped with z atomic percent Si or Ge; (f) forming a first mask over said fifth layer having opening above selected ones of said conductive regions; (g) etching through said first mask and said second through fifth layers; (h) removing said first mask; (i) forming a second mask over said fifth layer having an interconnect pattern for interconnecting said selected ones of said conductive regions; (j) etching through said second mask and said forth and fifth layers; and (k) filling said openings in said second through fifth layers and said fourth and fifth layer with a metal. In accordance with the above method of the instant invention, v, w, x, y and z may be the same or different and are in the range from about 0 to about 25. More preferably, v, w, x, y and z are in the range from about 5 to about 15.

It should be noted that the instant invention also contemplates the replacement of one or more, but not all, of the aforementioned diamond-like carbon layers with silicon oxide, silicon nitride or with other dielectric materials which are commonly used in such applications.

The first through fifth layers comprising a diamond-like carbon material mentioned hereinabove are deposited onto the surface of the substrate by those deposition techniques mentioned previously. The preferred means for depositing the first-fifth layers comprising the diamond-like carbon material is by PACVD.

The PACVD deposition of these layers is carried out using the same conditions previously described hereinabove. It is a preferred embodiment of the present invention that the first-fifth layers be composed of diamond-like carbon which is deposited using cyclohexane. The use of such a material is especially important, since it has a dielectric constant which is lower than 3.2 and it results in a material which is isotropic in nature. The thickness of the first five layers of the integrated structure of the instant invention may vary depending on the application.

The masks that are employed in the present invention include photomasks that are commonly employed in the art. In accordance with the method of the present invention, it is especially preferred that the first mask that is formed over the fifth layer have an opening above at least one of the conductive regions which are present on the substrate. Additionally, it is another preferred embodiment of this method that the second mask that is formed over the fifth layer have an interconnect pattern thereon. This interconnection pattern is employed in the instant invention to interconnect the conductive regions of the structure to one another.

Etching of the exposed areas of the masks and the deposited layers is accomplished by $O_2$ plasma treatments using reactive ion etching processes that are well known in the art. Etching may also be accomplished using a $CF_4$ plasma. This etching process results in the formation of openings in the second through fifth layers and the fourth and fifth layers of the interconnect structure of the instant invention.

These openings that are formed in the interconnect structure of the instant invention are filled with a metal selected from the group consisting of Al, Cu, Ta, Ti, Nb, W and Cr. Compounds or alloys of the above-mentioned metals are also contemplated herein. If a compound of one of these metals is employed it is preferred that the compound be a nitride or silicide/nitride of one of the above-mentioned metals.

It should be noted that the instant method of forming the interconnect structure of the present invention further includes a step of chemical-mechanical (chem-mech) polishing of the metal and the fifth layer. Chem-mech polishing is a technique well known in the art for planarizing the surface of a semiconductor device. Such a process, for example, is described in U.S. Pat. No. 5,246,884 to Jaso et al., the contents of which are incorporated herein by reference.

In accordance with another aspect of the instant invention, an interconnect structure for use on an integrated circuit chip is provided. Specifically, the interconnect structure of the present invention comprises: (a) a substrate having an upper surface with a first conductive region; (b) a first layer of diamond-like carbon material selected from the group consisting of hydrogenated amorphous carbon, amorphous carbon, amorphous diamond and fluorinated diamond-like carbon, wherein said diamond-like carbon material is doped with v atomic percent Si or Ge; and (c) a second layer of diamond-like carbon material selected from the group consisting of hydrogenated amorphous carbon, amorphous carbon, amorphous diamond, and fluorinated diamond-like carbon, wherein said diamond-like carbon material is doped with w atomic percent Si or Ge, wherein v and w may be the same or different and are from about 0 to about 25, more preferably v is from about 5 to about 15 and w is from about 2 to about 15. Moreover, the second layer of the interconnect structure of the present invention has a first interconnect pattern of a first metal formed therein and the first and second layers have studs of a second metal interconnecting selected ones of the first conductive regions and the first interconnect pattern.

The first and second metal layers that are present in the instant interconnect structure of the present invention are metals selected from the groups consisting of Al, Cu and W. Alloys of the aforementioned metals may also be employed in the present invention.

Accordingly, the interconnect structure of the instant invention may further comprise a third metal layer which layer is located between the sidewalls of the first layer having first interconnecting patterns thereon and the first metal. The metals which make up the third metal layer are selected from the group consisting of Al, Cu, W and alloys thereof.

In accordance with another aspect of the instant invention, a method for selectively etching a diamond-like material carbon material is provided. Specifically, the method of the instant invention comprises (a) selecting a substrate having an upper surface; (b) forming a first layer of diamond-like carbon material doped with v atomic % of Si or Ge on said upper surface of said substrate; (c) forming a second layer of diamond-like carbon material over the first layer; (d) forming a pattern layer over said second layer; (e) introducing a gas containing $O_2$; (f) reactive ion etching the second layer where exposed through the pattern layer; and (g) terminating the reactive ion etching step prior to etching through the first layer. In the present invention v is from about 0.1 to about 25; more preferably v is from about 5 to about 15.

The apparatus, materials and conditions employed for depositing the diamond-like carbon material have been indicated previously hereinabove.

It is emphasized that this first diamond-like carbon layer which is doped with Si or Ge provides etch resistance to the $O_2$ plasma which is further greater than the prior art etch stops which do not use such a material. Furthermore, diamond-like carbon films described in the prior art have a high etching rate which is unsatisfactory in some applications. To lower the etching rate and thus improve the performance of diamond-like carbon as an etch stop or polishing stop layer, diamond-like carbon is doped with Si in the instant invention.

Reactive ion etching using $O_2$ is achieved by using techniques well known in the art. For example, $O_2$ ashing can be used to remove the second hydrogenated carbon layer by using a power density of about 0.1 to about 2 $W/cm^2$ at a pressure of about 1 to about 1000 mTorr. A removal rate of about 5 to about 1000 nm/min is obtained using these conditions.

Figure 4:
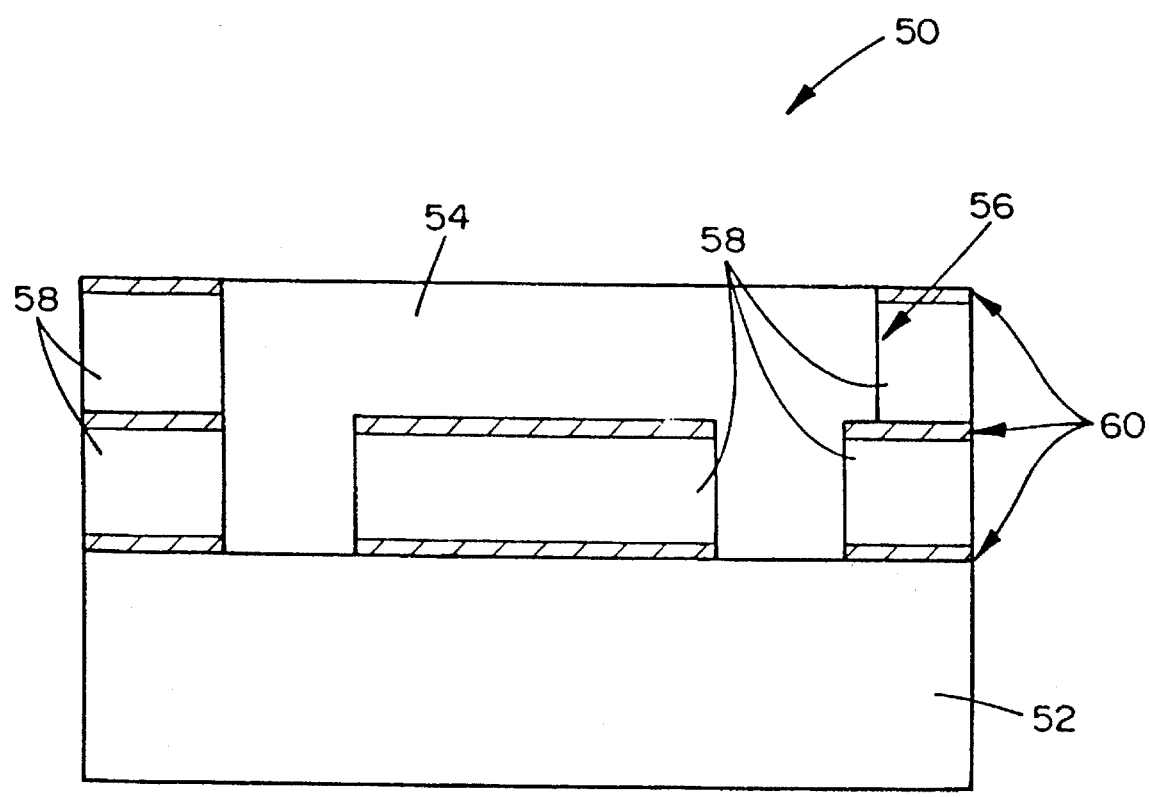
FIG. 4 is a cross-sectional view of an ULSI interconnect system of the instant invention which contains a diamond-like carbon interlevel and intralevel dielectric layer.

FIG. 4 is a cross-sectional view of an ULSI interconnect structure which was prepared in accordance with the method of the present invention. The ULSI interconnect structure 50 comprises a substrate 52, Cu interconnects and studs 54, a Ta liner 56, diamond-like carbon interlevel and intralevel dielectric layers 58, and a Si-doped diamond-like carbon RIE stop and barrier layer 60.

The present invention also provides a method for forming patterns in $SiO_2$ which method comprised the steps of (a) selecting a substrate having an upper surface; (b) forming a layer of diamond-like carbon material over said substrate; (c) forming a layer of $SiO_2$ over said diamond-like carbon material; (d) forming a patterned layer over the $SiO_2$ layer; (e) introducing a gas containing fluorine such as $CF_4$; (f) reactive ion etching the $SiO_2$ layer when exposed through said patterned layer; and (g) terminating the reactive ion etching step prior to etching through the layer of said material; i.e. the diamond-like carbon layer.

The conditions employed for depositing the diamond-like carbon film onto the substrate have been discussed previously hereinabove. $SiO_2$ is deposited using techniques that are well known in the art. For example in the present invention, the $SiO_2$ layer is deposited using a CVD technique. Reactive ion-etching using a fluorine containing gas such as $CF_4$ is also performed using techniques well known in the art.

Figure 5:
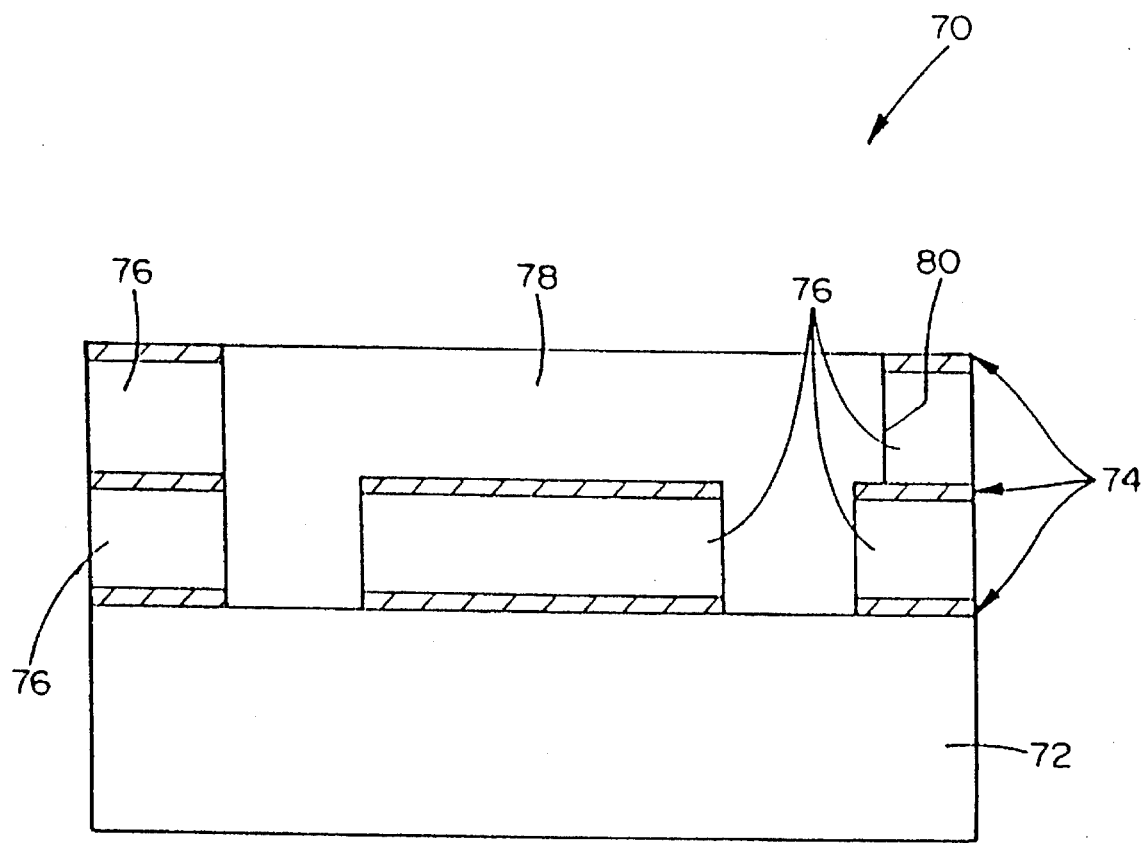
FIG. 5 is a cross-sectional view of a ULSI wiring system which comprises a plasma-deposited diamond-like carbon film as a $CF_4$ or $O_2$ RIE stop layer.

FIG. 5 is a cross-sectional view of a ULSI wiring system 70 which comprises a substrate 72, a diamond layer carbon film as an etch stop layer 74, a $SiO_2$ or polymeric layer 76, and Al, W or Cu interconnects or studs 78 embedded in the $SiO_2$ or polymeric layer 76. The ULSI wiring system also includes a Ta or TaN liner 80 when Cu interconnects or studs 78 are employed. The process of the instant invention mentioned hereinabove is used to provide the above planarized ULSI wiring system shown in FIG. 5.

As stated previously herein, the use of diamond-like carbon material in semiconductor devices represents an advance in the art since such a material reduces the parasitic capacitance and crosstalk of the device. Moreover, diamond-like carbon material has a lower dielectric constant which is uniform in all directions. Additionally, since diamond-like carbon is a hard material a layer containing diamond-like carbon doped with Si may be used as an effective etch stop or polishing layer for use in preparing planarized semiconductor devices.

While the invention has been particularly shown and described with respect to preferred embodiment thereof, it will be understood by those skilled in the art that the foregoing and other changes in form and details may be made therein without departing from the spirit and scope of the instant invention.

Having thus described our invention, what we claim as new, and desire to secure by Letters Patent is:

1. An insulator for spacing apart one or more levels of conductors comprising:

a substrate having an upper surface with exposed first regions of metal imbedded therein;

an insulator layer of diamond-like carbon material formed on said surface of said substrate, and a layer of metal patterned to form a plurality of conductors on said insulator layer.

2. The insulator of claim 1 wherein the exposed first regions of metal is at least one metal selected from the group consisting of Al, Cu, W, Ta, Ti and alloys thereof.

3. The insulator of claim 1 wherein the diamond-like carbon material is selected from the group consisting of hydrogenated amorphous carbon, amorphous carbon, amorphous diamond, fluorinated hydrogenated amorphous carbon, fluorinated amorphous carbon and fluorinated amorphous diamond.

4. The insulator of claim 1 wherein the diamond-like carbon material is formed by a process selected from the group consisting of plasma assisted chemical vapor deposition, sputtering, ion beam deposition and laser ablation.

5. The insulator of claim 1 wherein the substrate is an integrated circuit chip containing at least one field effect transistor (FET).

6. The insulator of claim 1 wherein the substrate is an integrated circuit chip containing a complementary metal oxide semiconductor (CMOS) device.

7. An interconnect structure comprising:

a substrate having an upper surface with an exposed first area of metal and an exposed second area of insulation selected from the group consisting of $SiO_2$ and diamond-like carbon material, wherein said exposed first area of metal and said exposed second area of insulation are embedded in said substrate;

a first layer of diamond-like carbon material formed on said upper surface of said substrate;

a second layer of metal patterned to form a plurality of conductors on said first layer; and a metal feed through electrically connecting selected first areas to one or more of said plurality of conductors.

8. The interconnect structure of claim 7 wherein the exposed first area of metal is at least one metal selected from the group consisting of Al, Cu, W, Ta, Ti and alloys thereof.

9. The interconnect structure of claim 7 wherein the diamond-like carbon material is selected from the group consisting of hydrogenated amorphous carbon, amorphous carbon, amorphous diamond, fluorinated diamond-like carbon, fluorinated hydrogenated amorphous carbon, fluorinated amorphous carbon and fluorinated amorphous diamond.

10. The interconnect structure of claim 7 wherein the diamond-like carbon material is formed by a process selected from the group consisting of plasma assisted chemical vapor deposition, sputtering, ion beam deposition and laser ablation.

11. The interconnect structure of claim 7 wherein the substrate is an integrated circuit chip containing at least one transistor.

12. The interconnect structure of claim 7 wherein the substrate is an integrated circuit chip containing a complementary metal oxide semiconductor (CMOS) device.

13. An interconnect structure comprising:

a substrate having an upper surface with first conductive regions embedded therein;

a first layer of diamond-like carbon material on said upper surface of said substrate, wherein said diamond-like carbon material is selected from the group consisting of hydrogenated amorphous carbon, amorphous carbon, amorphous diamond, fluorinated diamond-like carbon, fluorinated hydrogenated amorphous carbon, fluorinated amorphous carbon and fluorinated amorphous diamond and wherein said diamond-like carbon material is doped with v atomic percent Si or Ge;

a second layer of diamond-like carbon material on said first layer, wherein said diamond-like carbon material is selected from the group consisting of hydrogenated amorphous carbon, amorphous carbon, amorphous diamond, fluorinated diamond-like carbon, fluorinated hydrogenated amorphous carbon, fluorinated amorphous carbon and fluorinated amorphous diamond, wherein said diamond-like carbon material is doped with w atomic percent Si or Ge, wherein v and w are the same or different and are in the range from about 0 to about 25;

said second layer having a first interconnect pattern of a first metal formed on said second layer; and said first and second layers having studs of a second metal interconnecting selected ones of said first conductive regions and said first interconnect pattern.

14. The interconnect structure of claim 13 wherein v is from about 5 to about 15 and w is from about 2 to about 15.

15. The interconnect structure of claim 13 wherein the fluorinated diamond-like carbon includes at least 1 atomic percent fluorine atoms covalently bound to carbon atoms of said fluorinated diamond-like carbon.

16. The interconnect structure of claim 13 wherein the diamond-like carbon material is hydrogenated amorphous carbon.

17. The interconnect structure of claim 13 wherein the first metal is selected from the group consisting of Al, Cu, W and alloys thereof.

18. The interconnect structure of claim 13 wherein the second metal is selected from the group consisting of Al, Cu, W and alloys thereof.

19. The interconnect structure of claim 18 further including a third metal layer between sidewalls of said first layer of said first or said second metals and said first or second layer of diamond-like carbon materials.

20. The interconnect structure of claim 19 wherein the third metal is selected from the group consisting of Ta, Ti, W, Cr and alloys thereof.

21. The insulator of claim 3 wherein said diamond-like carbon material is doped with x atomic percent of a dopant selected from the group consisting of Si and Ge.

22. The insulator of claim 21 wherein said x atomic percent is in the range from about 0 to about 25 atomic percent.

23. The insulator of claim 21 wherein said x atomic percent is in the range from about 5 to about 15 atomic percent.

24. The interconnect structure of claim 9 wherein said diamond-like carbon material is doped with v atomic percent of a dopant selected from the group consisting of Si and Ge.

25. The interconnect structure of claim 24 wherein said v atomic percent is in the range from about 0 to about 25 atomic percent.

26. The interconnect structure of claim 24 wherein said v atomic percent is in the range from about 5 to about 15 atomic percent.

27. The interconnect structure of claim 13 wherein one of said first and second layers of diamond-like carbon material is replaced with another dielectric material.

28. The interconnect structure of claim 27 wherein said another dielectric material is selected from the group consisting of silicon oxide and silicon nitride.

29. The interconnect structure of claim 13 wherein said v is in the range from about 5 to about 15 atomic percent.

30. An insulator for a level of interconnection wiring comprising:

a substrate having an upper surface with exposed first regions of metal embedded therein;

a first layer of metal patterned to form a plurality of conductors on said substrate; and a first insulator layer of diamond-like carbon material formed on said upper surface of said substrate between conductors of said plurality of conductors.

31. The insulator of claim 30 wherein the exposed first regions of metal is at least one metal selected from the group consisting of Al, Cu, W, Ta, Ti and alloys thereof.

32. The insulator of claim 30 wherein the diamond-like carbon material is selected from the group consisting of hydrogenated amorphous carbon, amorphous carbon, amorphous diamond, fluorinated hydrogenated amorphous carbon, fluorinated amorphous carbon and fluorinated amorphous diamond.

33. The insulator of claim 30 wherein the diamond like carbon is formed by a process selected from the group consisting of plasma assisted chemical vapor deposition, sputtering, ion beam deposition and laser ablation.

34. The insulator of claim 30 wherein the substrate is an integrated circuit chip containing at least one field effect transistor (FET).

35. The insulator of claim 30 wherein the substrate is an integrated circuit chip containing a complementary metal oxide semiconductor (CMOS) device.

36. The insulator of claim 30 wherein said first insulator layer and said plurality of conductors have a coplanar upper surface.

37. The insulator of claim 30 further including a second insulator layer over said first insulator layer and said plurality of conductors.

38. The insulator of claim 37 wherein said second layer of insulator is selected from the group consisting of diamond-like carbon material, silicon dioxide and silicon nitride.

39. The insulator of claim 1 wherein said diamond-like carbon material has a dielectric constant of $\leq 3.2$.

40. The interconnect structure of claim 7 wherein said diamond-like carbon material has a dielectric constant of $\leq 3.2$.

41. The interconnect structure of claim 13 wherein said diamond-like carbon material has a dielectric constant of $\leq 3.2$.

42. The insulator of claim 30 wherein said diamond-like carbon material has a dielectric constant of $\leq 3.2$.

* * * * *

UNITED STATES PATENT AND TRADEMARK OFFICE
CERTIFICATE OF CORRECTION

PATENT NO. : 5,559,367
DATED : September 24, 1996
INVENTOR(S) : Stephen A. Cohen, et al.

It is certified that error appears in the above-indentified patent and that said Letters Patent is hereby corrected as shown below:

Column 1, line 58: "carboil" should read --carbon--.

Signed and Sealed this

Eighteenth Day of March, 1997

Attest:

BRUCE LEHMAN

*Attesting Officer*   Commissioner of Patents and Trademarks